US012368459B2

(12) United States Patent
He et al.

(10) Patent No.: US 12,368,459 B2
(45) Date of Patent: Jul. 22, 2025

(54) RESIDUAL NEURAL NETWORK MODELS FOR DIGITAL PRE-DISTORTION OF RADIO FREQUENCY POWER AMPLIFIERS

(71) Applicant: SAMSUNG ELECTRONICS CO., LTD., Suwon-si (KR)

(72) Inventors: Ziming He, Cambridge (GB); Fei Tong, Cambridge (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 522 days.

(21) Appl. No.: 17/805,698

(22) Filed: Jun. 7, 2022

(65) Prior Publication Data

US 2023/0111606 A1    Apr. 13, 2023

Related U.S. Application Data

(60) Provisional application No. 63/254,636, filed on Oct. 12, 2021.

(51) Int. Cl.
*G06N 3/045* (2023.01)
*G06N 3/044* (2023.01)
(Continued)

(52) U.S. Cl.
CPC ......... *H04B 1/0475* (2013.01); *G06N 3/044* (2023.01); *G06N 3/045* (2023.01); *H03F 1/3247* (2013.01)

(58) Field of Classification Search
CPC ......... G06N 3/08; G06N 3/044; G06N 3/045; G06N 3/0464; G06N 3/02; G06N 20/00;
(Continued)

(56) References Cited

U.S. PATENT DOCUMENTS 8,976,893 B2    3/2015  Bai
9,276,533 B2    3/2016  Lozhkin
(Continued)

OTHER PUBLICATIONS

Morgan, et al., "A Generalized Memory Polynomial Model for Digital Predistortion of RF Power Amplifiers", IEEE Transactions on Signal Processing, vol. 54, No. 10, pp. 3852-3860, Oct. 2006.
(Continued)

*Primary Examiner* — Tu X Nguyen
(74) *Attorney, Agent, or Firm* — Morgan, Lewis & Bockius LLP

(57) ABSTRACT

One or more aspects of the techniques and models described herein provide for bidirectional recurrent neural network (BiRNN)-based digital pre-distortion techniques for radio frequency (RF) power amplifiers (PAs). As an example, a digital pre-distorter (DPD) system may implement residual learning and long short-term memory (LSTM) projection layer features to reduce computational complexity and memory requirements. Implementing the described unconventional techniques of applying residual learning in RNN (e.g., in BiLSTM), using LSTM projection to develop a DPD structure, or both, may provide several advantages over preexisting techniques. For instance, the complexity in training and pre-distortion may be reduced and significantly less memory may be required to store the DPD neural network coefficients (e.g., while achieving similar or better linearization performance compared to other LSTM models). Further, faster training convergence speed may be achieved (e.g., compared to other LSTM models).

18 Claims, 7 Drawing Sheets

(51) Int. Cl.
*H03F 1/32* (2006.01)
*H04B 1/04* (2006.01)

(58) Field of Classification Search
CPC .. G06N 3/094; H03F 1/32; H03F 3/20; H03F 3/24; H04B 1/04
See application file for complete search history.

(56) References Cited

U.S. PATENT DOCUMENTS

| | | | |
|---|---|---|---|
| 10,581,469 | B1 | 3/2020 | O'Shea et al. |
| 10,810,482 | B2 | 10/2020 | Kim et al. |
| 10,949,456 | B2 | 3/2021 | Tomberg et al. |
| 10,963,782 | B2 | 3/2021 | Xiong et al. |
| 2021/0013844 | A1 | 1/2021 | Choi et al. |
| 2022/0052885 | A1* | 2/2022 | Luo .............. H04L 25/0254 |

OTHER PUBLICATIONS

Liu, et al., "Dynamic Behavioral Modeling of 3G Power Amplifiers Using Real-Valued Time-Delay Neural Networks", IEEE Transactions on Microwave Theory and Techniques, vol. 52, No. 3, pp. 1025-1033, Mar. 2004.

Wang, et al., "Augmented Real-Valued Time-Delay Neural Network for Compensation of Distortions and Impairments in Wireless Transmitters", IEEE Transactions on Neural Networks and Learning Systems, vol. 30, No. 1, pp. 242-254, Jan. 2019.

Hongyo, et al., "Deep Neural Network-Based Digital Predistorter for Doherty Power Amplifiers", IEEE Microwave and Wireless Components Letters, vol. 29, No. 2, pp. 146-148, Feb. 2019.

Tarver, et al., "Design and Implementation of a Neural Network Based Predistorter for Enhanced Mobile Broadband", IEEE Int. Workshop on Signal Process. Syst. (SiPS), arXiv preprint: arXiv:1907.00766v1 [eess.SP] Jul. 1, 2019, 7 pages.

Wu, et al., "Residual Neural Networks for Digital Predistortion," IEEE Global Commun. Conf. (Globecom), arXiv preprint: arXiv:2005.05655v2 [eess.SP] Oct. 18, 2020, 6 pages.

Hu, et al., "Convolutional Neural Network for Behavioral Modeling and Predistortion of Wideband Power Amplifiers," IEEE Transactions on Neural Networks and Learning System, Feb. 2021, pp. 1-15.

Phartiyal, et al., "LSTM-Deep Neural Networks based Predistortion Linearizer for High Power Amplifiers", in Proc. National Conference on Communication(NCC), Bangalore, India, Feb. 2019, 5 pages.

Sun, et al., "Behavioral Modeling and Linearization of Wideband RF Power Amplifiers Using BiLSTM Networks for 5G Wireless Systems", IEEE Transactions on Vehicular Technology, vol. 68, No. 11, pp. 10348-10356, Nov. 2019.

Hochreiter et al., "Long Short-Term Memory", Neural Computation, vol. 9, No. 8, pp. 1735-1780, Nov. 1997.

Schuster, et al., "Bidirectional Recurrent Neural Networks", IEEE Transactions on Signal Processing, vol. 45, No. 11, pp. 2673-2681, Nov. 1997.

Sak, et al., "Long Short-Term Memory Based Recurrent Neural Network Architectures for Large Vocabulary Speech Recognition", IEEE Int. Conf. on Acoustics, Speech, and Signal Process. (ICASSP), arXiv preprint: arXiv:1402.1128v1 [cs.NE] Feb. 5, 2014, 5 pages.

* cited by examiner

RESIDUAL NEURAL NETWORK MODELS FOR DIGITAL PRE-DISTORTION OF RADIO FREQUENCY POWER AMPLIFIERS

CROSS-REFERENCE TO RELATED APPLICATION

This application claims priority to, and the benefit of, U.S. Provisional Application Ser. No. 63/254,636 filed on Oct. 12, 2021, entitled REDUCED COMPLEXITY BILSTM MODELS FOR RF POWER AMPLIFIER BEHAVIORAL MODELING AND DIGITAL PRE-DISTORTION. The entire contents of the foregoing application are hereby incorporated by reference for all purposes.

BACKGROUND

The following relates generally to radio frequency power amplification, and more specifically to reduced complexity residual neural network (BiRNN) models for digital pre-distortion of radio frequency (RF) power amplifiers (PAs).

Wireless transmission may be achieved by outputting a signal generated by processing data to be transmitted, e.g., source data, through an antenna. For example, source data may be processed by operations such as encoding, modulation, digital-to-analog-conversion, upconversion, amplification, and the like. Digital or analog signals may be processed. In the processing of an analog signal for wireless transmission, the performance may vary due to various factors, and such variations of the performance may impact the efficiency of wireless transmission.

For instance, a wireless communication device may include a transmitter to provide a RF-band signal to an antenna. The transmitter may include components (e.g., a filter, a power amplifier, and a mixer) to generate the RF-band signal from an input baseband signal (e.g., to generate an output signal for transmission from an input signal or a source signal). When processing the input baseband signal, the generated RF-band output signal may be distorted due to characteristics of the transmitter's components. For example, the transmitter may have nonlinearity between the input baseband signal and the RF-band signal, thereby distorting the generated RF-band signal (e.g., which may result in interference in wireless communications).

Generally, a PA may exhibit stronger nonlinearity when the PA operates closer to its saturation point. To reduce the nonlinearity, a PA can be backed off from its saturation point, however, such may result in reduced power efficiency.

In some aspects, when large signal bandwidth is used (e.g., such as in emerging WiFi and cellular systems), the function of a PA becomes more complex with strong non-linearity and memory effects. Further, when there is an increase in frequency of generated RF-band signals (e.g., when high carrier frequencies for wireless communications are employed) and multiple antennas (e.g., or an antenna array) are used, the distortion of the RF-band signal due to the nonlinearity of the transmitter may worsen (e.g., and the nonlinearity of the transmitter may not be effectively compensated).

Accordingly, improved signal power amplification techniques for communication systems may be desired.

SUMMARY

A method, apparatus, non-transitory computer readable medium, and system for reduced complexity bidirectional residual neural network (BiRNN) models for digital pre-distortion of power amplifiers (PAs) are described. One or more aspects of the method, apparatus, non-transitory computer readable medium, and system include receiving an input signal at a first power level; modifying the input signal using a digital pre-distorter (DPD) to obtain a pre-distorted signal, wherein the DPD comprises a neural network trained to output on a residual signal comprising a difference between the pre-distorted signal and the input signal; and amplifying the pre-distorted signal to obtain an output signal having a second power level that is higher than the first power level.

A method, apparatus, non-transitory computer readable medium, and system for training reduced complexity BiRNN models for digital pre-distortion of PAs are described. One or more aspects of the method, apparatus, non-transitory computer readable medium, and system include receiving an input signal; modifying the input signal using a DPD to obtain a pre-distorted signal, wherein the DPD comprises a neural network that generates a residual signal representing a difference between the pre-distorted signal and the input signal; computing a reference residual signal based on the pre-distorted signal; and training the neural network based on a comparison of the residual signal and the reference residual signal.

An apparatus, system, and method for reduced complexity BiRNN models for digital pre-distortion of PAs are described. One or more aspects of the apparatus, system, and method include a processor configured to generate an input signal at a first power level; a DPD configured to modify the input signal to obtain a pre-distorted signal, wherein the DPD comprises a neural network trained based on a residual signal comprising a difference between a training input signal and a training reference signal; and an amplifier configured to amplify the pre-distorted signal to obtain an output signal having a second power level that is higher than the first power level.

DETAILED DESCRIPTION

Figure 1:
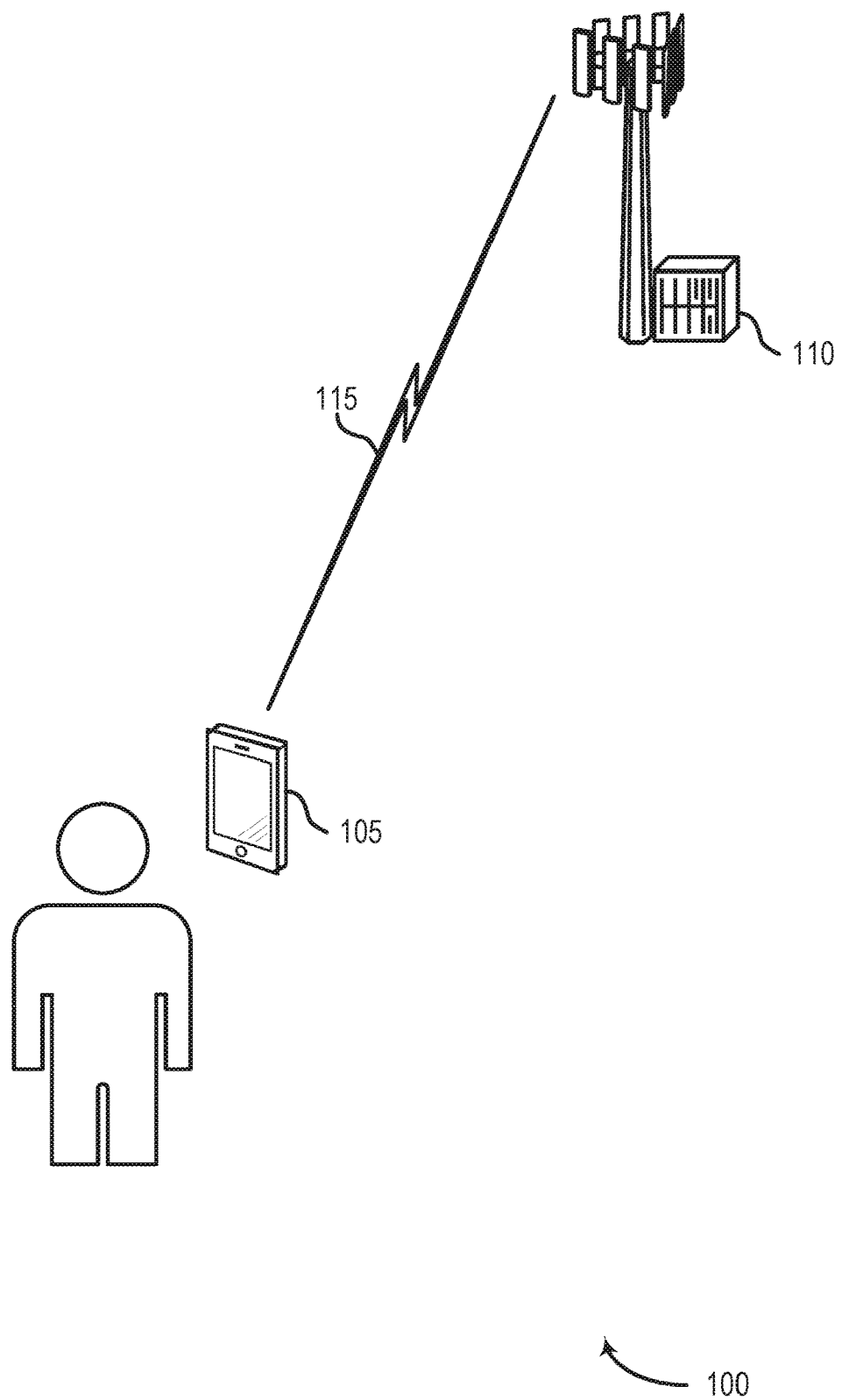
FIG. 1 shows an example of a communications system according to aspects of the present disclosure.

Devices for wireless communication may include transmitters providing radio frequency (RF) signals that are output to antennas. A transmitter may include components for generating the RF signals from baseband signals, such as a mixer for upconverting the baseband signals to RF signals, one or more filters, and an RF power amplifier (PA). When the baseband signals are processed by the components of the transmitter, the RF signals may become distorted due to characteristics of the components. For example, the power amplifier in particular may exhibit nonlinear gain and phase as a function of input signal power, and this nonlinearity may degrade communication quality by distorting the RF output signals. In the case of digital baseband signals, distortion due to operation in a gain compression region of the power amplifier may lead to excessive bit errors particularly for bits represented by relatively higher power signals. To reduce distortion, a digital pre-distortion or RF pre-distortion technique may be used to pre-distort the input RF signal to the power amplifier in a complementary manner to the power amplifier characteristics. However, at higher RF frequencies and in the presence of a plurality of antenna elements of an antenna array (where mutual coupling may affect the power amplifiers), the RF signal distortion may be exacerbated and may be more difficult to compensate using conventional pre-distortion methods.

Behavioral models of a radio frequency (RF) power amplifier (PA) may define a basic structure of digital pre-distortion. In some cases, conventional behavioral models (e.g., general memory polynomial (GMP) based behavioral models) have been widely to model wideband PAs. However, in some aspects the high correlation between polynomial bases in such models makes it difficult to improve their modelling performance. In some cases, neural network (NN) based PA behavioral models and digital pre-distorters (DPDs) may be implemented (e.g., such as feedforward NNs, convolutional neural networks (CNNs), long short-term memory (LSTM) networks, etc.). LSTM is a recurrent neural network (RNN) that may be implemented to solve the vanishing or exploding gradients and fading memory issues in traditional RNNs (e.g., which, in some aspects, may be enhanced by employing 'bidirectional' RNNs). LSTM is a technique used in some modern deep learning applications (e.g., such as natural language processing (NLP)).

An example feedforward NN model for PA modelling or digital pre-distortion may include real-valued time-delay neural networks (RVTDNNs). To account for memory effects in actual PAs, such models may use several delayed versions of in-phase and quadrature (I/Q) components of baseband signal samples as the inputs (e.g., and only 2 outputs for I/Q components). In some cases, augmented real-valued time-delay neural network (ARVTDNN) models may enhance the linearization performance. The difference is that the inputs of such models use powers of baseband signal amplitude in addition to the delayed versions of I/Q components.

In some aspects, shallow NNs may have a small number of hidden layers with a small number of neurons in each layer. In some aspects, a CNN-based DPDs may reduce complexity for behavioral modelling and predistortion of wideband PAs. Shallow NNs may tradeoff lower complexity for low generalization capability. With the introduction of deep learning technology, complex function approximations and classifications may be more reliable and accurate. When large signal bandwidth is used (e.g., such as in recent standards of WiFi and cellular systems), the function of PAs becomes more complex with strong nonlinearity and memory effects. Moreover, a PA may exhibit stronger nonlinearity when the PA operates closer to its saturation point. To reduce the nonlinearity, a PA can be backed off from its saturation point, however, such may result in reduced power efficiency. A deep feedforward NN (e.g., a time delay deep neural network (TD-DNN)) improve linearization performance (e.g., when the number of layers and number of neurons in the layers increase). In terms of LSTM, a NN model (e.g., a bidirectional LSTM (BiLSTM) network for 5G wireless systems) used for 100 MHz signal bandwidth may be much 'deeper' than, for example, other LSTM-deep neural networks used for 10 MHz bandwidth.

According to one or more aspects described herein, a RNN model (e.g., a LSTM/BiLSTM model, a gated recurrent unit (GRU)/BiGRU model, etc.) may utilize and/or implement unconventional techniques of residual learning and LSTM projection to construct improved neural network models for PA behavioral modelling and digital pre-distortion. The described techniques and resulting models reduce computational complexity, reduce memory requirements, and increase training convergence speed (e.g., compared to other LSTM/BiLSTM models). Moreover, described techniques and resulting models may improve linearization performance (e.g., in terms of error vector magnitude (EVM)) compared to other LSTM/BiLSTM models.

System Architecture:

FIG. 1 shows an example of a communications system 100 according to aspects of the present disclosure. In one aspect, communications system 100 includes transmitting device 105, receiving device 110, and communications link 115. Transmitting device 105 is an example of, or includes aspects of, the corresponding element described with reference to FIG. 2.

Communications systems may be implemented to exchange information or data between two or more entities (e.g., devices). For instance, in the example communications system 100 of FIG. 1, information or data may be exchanged between a transmitter and a receiver, such as between a transmitting device 105 and a receiving device 110 via communications link 115. Generally, communications systems may include telecommunications systems, optical communications systems, radio communications systems, etc. A wireless communications system is an example of a communications system where information or data is exchanged without physical wires connecting the communicating devices. For instance, wireless transmission may be achieved by outputting a signal generated by processing data to be transmitted (e.g., e.g., source data) through an antenna.

In some cases, a communication device (e.g., a transmitting device 105) may utilize a PA to improve the efficiency of communications (e.g., signals transmitted to a receiving device 110) based on channel information (e.g., which refers to information describing the channel properties of communications link 115). For example, a signal may be amplified by transmitting device 105 to compensate for how a signal may propagate from the transmitting device 105 to the receiving device 110, where the signal propagation may be affected by combined effects of, for example, scattering, fading, power decay, etc. For instance, in some aspects, transmitting device 105 may implement a power amplification techniques to adapt transmission procedures based on channel conditions associated with communications link 115, characteristics of communications link 115, transmitting device 105 characteristics, receiving device 110 characteristics, etc.

As described in more detail herein (e.g., with reference to FIGS. 2, 3, and 6), power amplification systems may include, for example, a DPD, a PA, a transmitter, etc. A DPD may be configured to modify an input signal to obtain a pre-distorted signal (e.g., based on characteristics of a PA). In some aspects, the DPD may include a neural network trained based on a residual signal comprising a difference between a training input signal and a training reference signal). According to the techniques and systems described herein, devices (e.g., such as transmitting device 105) may implement residual learning in RNN-based DPD models, as well as LSTM projection for DPD models. Implementation of such systems and techniques may result in improving the rate and reliability of communications between transmitting device 105 and receiving device 110.

Generally a device 105 may include any computing device, such as a personal computer, laptop computer, mainframe computer, palmtop computer, personal assistant, mobile device, or any other suitable processing apparatus.

In some aspects, device 105 (e.g., as well as device 110) may include a transceiver for wireless communications. A transceiver may communicate bi-directionally, via antennas, wired, or wireless links as described herein. For example, the transceiver may represent a wireless transceiver and may communicate bi-directionally with another wireless transceiver. The transceiver may also include or be connected to a modem to modulate the packets and provide the modulated packets to for transmission, and to demodulate received packets. In some examples, transceiver may be tuned to operate at specified frequencies. For example, a modem can configure the transceiver to operate at a specified frequency and power level based on the communication protocol used by the modem.

As an example, communications system 100 may include a wireless communications system. A wireless communications system may include a number of base stations and other network entities. For instance, in one example, a receiving device 110 may include a base station that may communicate with (e.g., receive transmissions from) a transmitting device 105 (e.g., which may include or be referred to as a user equipment (UE). Each base station may provide communication coverage for a particular geographic area. In 3GPP, the term "cell" can refer to a coverage area of the base station and/or a coverage area depending on the context in which the term is used. In NR systems, the term "cell" and NB, next generation NB (gNB), 5G NB, access point (AP), BS, NR BS, or transmission reception point (TRP) may be interchangeable. In some examples, the base stations may be interconnected to one another and/or to one or more other base stations or network nodes (not shown) in the wireless network through various types of backhaul interfaces such as a direct physical connection, a virtual network, or the like using any suitable transport network.

Figure 2:
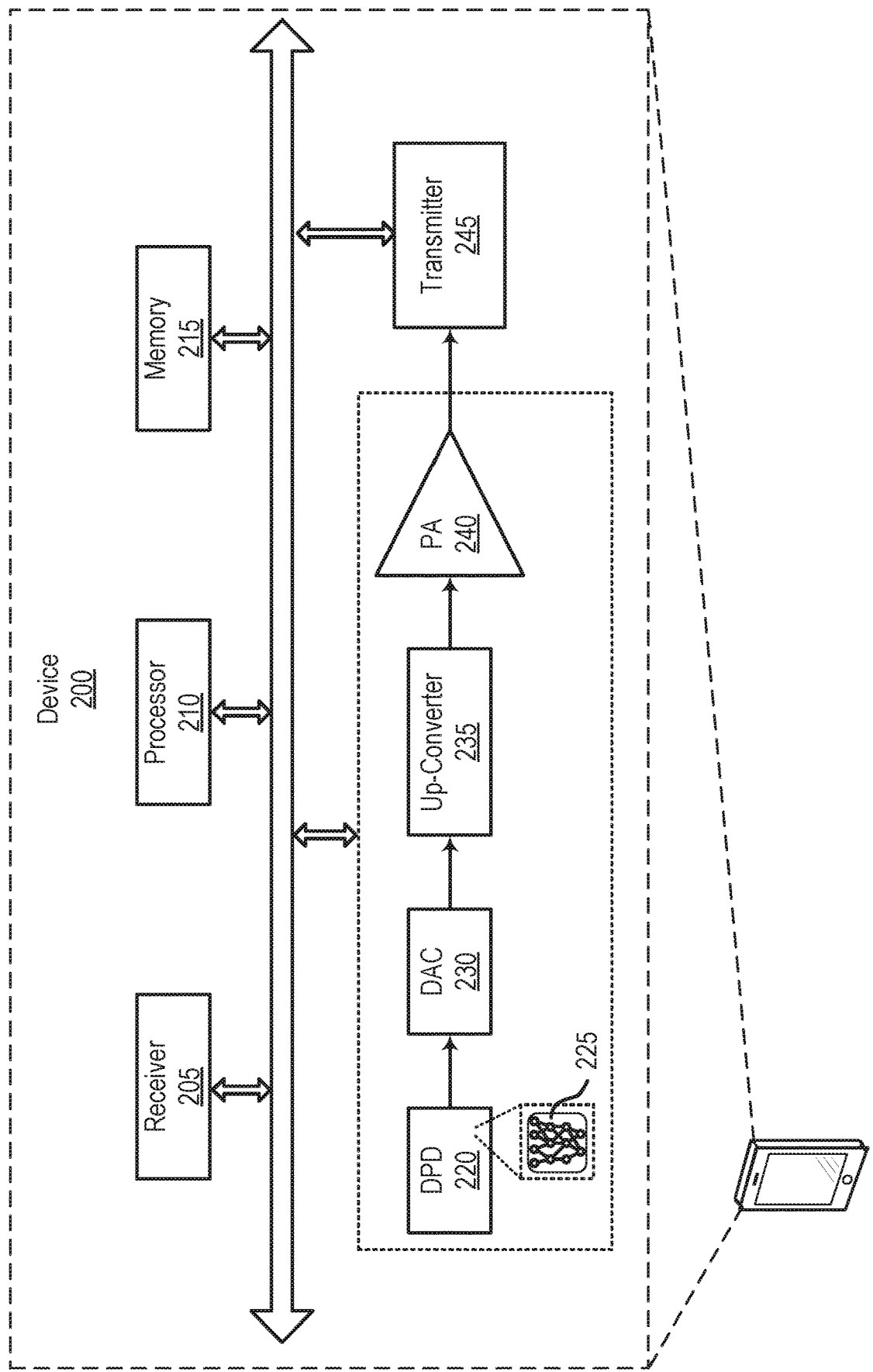
FIG. 2 shows an example of a transmitting device according to aspects of the present disclosure.

FIG. 2 shows an example of a device 200 (e.g., a transmitting device) according to aspects of the present disclosure. Device 200 is an example of, or includes aspects of, the corresponding element described with reference to FIG. 1. In one aspect, device 200 includes receiver 205, processor 210, memory 215, DPD 220, DAC 230, up-converter 235, PA 240, and transmitter 245.

As described herein, a transmitting device (e.g., device 200) may have nonlinearity (e.g., corresponding to transmit signal power amplification procedures) due to characteristics of its components. For example, the PA 240 may have a nonlinear gain, and the nonlinear gain of the PA 240 may contribute to the nonlinearity of the transmitting device 200 (e.g., of the transmitter 245). According to techniques described herein, pre-distortion may be used to compensate the nonlinearity of the transmitting device 200. The pre-distortion may refer to a method of pre-distorting an input (e.g., a first baseband signal) of the transmitting device 200, based on nonlinearity that is opposite to the nonlinearity of the transmitting device 200 (e.g., of the transmitter 245). The nonlinearity of the transmitting device 200 may be compensated due to the pre-distortion, and a desirable output RF signal may be provided to an antenna of the transmitter 245. As described above, the nonlinearity of the transmitting device 200 may be determined by a plurality of components included in the transmitting device 200. When the transmitting device 200 is an integrated circuit (IC), the nonlinearity of the transmitting device 200 may be changed due to a process, voltage and temperature (PVT) variation. Thus, to precisely compensate the nonlinearity of the transmitting device 200, pre-distortion may be performed based on a feedback generated from an output of the transmitting device 200.

In some aspects, DPD 220 may pre-distort a transmission signal (e.g., an input signal) and generate a baseband signal (e.g., pre-distorted signal) for the PA 240 (e.g., where the PA 240 may amplify the pre-distorted signal to generate an output signal for transmission by the transmitter 245). DAC 230 may convert a digital signal output by the DPD 220 and output a baseband signal. In exemplary embodiments of the inventive concept, the input signal may be an analog signal, and the DPD 220 may be an analog pre-distorter. Herein, generally, it may be assumed that the DPD 220 is a digital pre-distorter and the DPD 220 may generate the pre-distorted signals. In exemplary embodiments of the inventive concept, the DPD 220 may include at least one of a hardware block designed by logic synthesis and a software block including a series of instructions.

According to techniques and systems described herein (e.g., with reference to, for example, FIG. 3), DPD 220 receives an input signal at a first power level and modifies the input signal to obtain a pre-distorted signal (e.g., where the DPD 220 includes a neural network 225 trained to output on a residual signal including a difference between the pre-distorted signal and the input signal). In some examples, DPD 220 generates a hidden representation of the input signal using neural network 225 (e.g., which may include implementation of an RNN). In some examples, DPD 220 generates the residual signal based on the hidden representation using neural network 225 (e.g., which may include implementation of an FNN). In some examples, DPD 220 combines the residual signal with the input signal to obtain the pre-distorted signal. In some examples, DPD 220 multiplies the hidden representation by a projection matrix to obtain a projected hidden representation, where the residual signal is generated based on the projected hidden representation. In some aspects, the projected hidden representation has fewer dimensions that the hidden representation.

DPD 220 is an example of, or includes aspects of, the corresponding element described with reference to FIG. 6. In one aspect, DPD 220 includes neural network 225. Neural network 225 is an example of, or includes aspects of, the corresponding element described with reference to FIGS. 3 and 6.

According to some aspects, DAC 230 performs a digital-to-analog conversion on the pre-distorted signal to obtain an analog signal, where the output signal is based on the analog signal. DAC 230 is an example of, or includes aspects of, the corresponding element described with reference to FIG. 6.

According to some aspects, up-converter 235 performs up-conversion on the pre-distorted signal to obtain a high-frequency signal, where the output signal is based on the high-frequency signal. Up-converter 235 is an example of, or includes aspects of, the corresponding element described with reference to FIG. 6.

According to some aspects, PA 240 amplifies the pre-distorted signal to obtain an output signal having a second power level that is higher than the first power level. PA 240 is an example of, or includes aspects of, the corresponding element described with reference to FIG. 6.

According to some aspects, transmitter 245 transmits the output signal to a receiver (e.g., to a receiving device, for example such as the receiving device 110 described with reference to FIG. 1). Transmitter 245 is an example of, or includes aspects of, the corresponding element described with reference to FIG. 6.

Accordingly, apparatuses and systems for RF power amplification are described. One or more aspects of an apparatus or a system according to the present disclosure may include a processor 210, a DPD 220, and a PA 240. The processor 210 may be configured to generate an input signal at a first power level. The DPD 220 may be configured to modify the input signal to obtain a pre-distorted signal (e.g., where the DPD 220 comprises a neural network 225 trained based on a residual signal comprising a difference between a training input signal and a training reference signal). The PA 240 may be configured to amplify the pre-distorted signal to obtain an output signal having a second power level that is higher than the first power level.

In some examples, the neural network 225 comprises an RNN and an FNN. In some examples, the RNN comprises a LSTM. In some examples, the RNN comprises a BiLSTM. In some examples, the RNN comprises a projected RNN. In some examples, the RNN comprises a BiGRU.

Some examples of apparatuses or systems described herein may further include a DAC 230 configured to convert the pre-distorted signal to an analog signal. Some examples of apparatuses or systems described herein may further include an up-converter 235 configured to convert the pre-distorted signal to a higher frequency. Some examples of apparatuses or systems described herein may further include a transmitter 245 configured to transmit the output signal (e.g., a transmitter 245 configured to transmit the amplified signal to a receiving device).

A receiver 205 may receive information such as packets, user data, or control information associated with various information channels (e.g., control channels, data channels, etc.). Information received at a receiver 205 may be passed on to other components of the device, such as a communication processor 210. In some cases, receiver 205 may be an example of aspects of a transceiver. In various examples, receiver 205 may utilize a single antenna or a plurality of antennas.

A processor 210 is an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor 210 is configured to operate memory 215 (e.g., a memory array) using a memory controller. In other cases, a memory controller may be integrated into the processor 210. In some cases, the processor 210 is configured to execute computer-readable instructions stored in a memory 215 to perform various functions. In some embodiments, a processor 210 includes special purpose components for modem processing, baseband processing, digital signal processing, or transmission processing.

Examples of memory 215 include random access memory (RAM), read-only memory (ROM), or a hard disk. Examples of memory 215 devices include solid state memory and a hard disk drive. In some examples, memory 215 is used to store computer-readable, computer-executable software including instructions that, when executed, cause a processor 210 to perform various functions described herein. In some cases, the memory 215 contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory 215 store information in the form of a logical state.

In some aspects, neural network 225 may include a hardware component and/or a software component that includes a number of connected nodes (i.e., neurons, which may loosely correspond to the neurons in a human brain). Each connection, or edge, transmits a signal from one node to another (like the physical synapses in a brain). When a node receives a signal, it processes the signal and then transmits the processed signal to other connected nodes. In some cases, the signals between nodes comprise real numbers, and the output of each node is computed by a function of the sum of its inputs. In some examples, nodes may determine their output using other mathematical algorithms (e.g., selecting the max from the inputs as the output) or any other suitable algorithm for activating the node. Each node and edge is associated with one or more node weights that determine how the signal is processed and transmitted.

During the training process, these weights are adjusted to improve the accuracy of the result (i.e., by minimizing a loss function which corresponds in some way to the difference between the current result and the target result). The weight of an edge increases or decreases the strength of the signal transmitted between nodes. In some cases, nodes have a threshold below which a signal is not transmitted at all. In some examples, the nodes are aggregated into layers. Different layers perform different transformations on their inputs. The initial layer is known as the input layer and the last layer is known as the output layer. In some cases, signals traverse certain layers multiple times.

A transmitter 245 may transmit signals generated by other components of the device 200. Information sent by a transmitter 245 may be received from other components of the device 200 (e.g., such from as a communication processor 210 after signal power amplification via PA 240). In some cases, transmitter 245 may be an example of aspects of a transceiver. In various examples, transmitter 245 may utilize a single antenna or a plurality of antennas.

In some cases, software may include code to implement one or more aspects of the present disclosure. Software may be stored in a non-transitory computer-readable medium such as memory 215. In some cases, the software may not be directly executable by the processor 210 but may cause a computer (e.g., when compiled and executed) to perform functions described herein.

Figure 3:
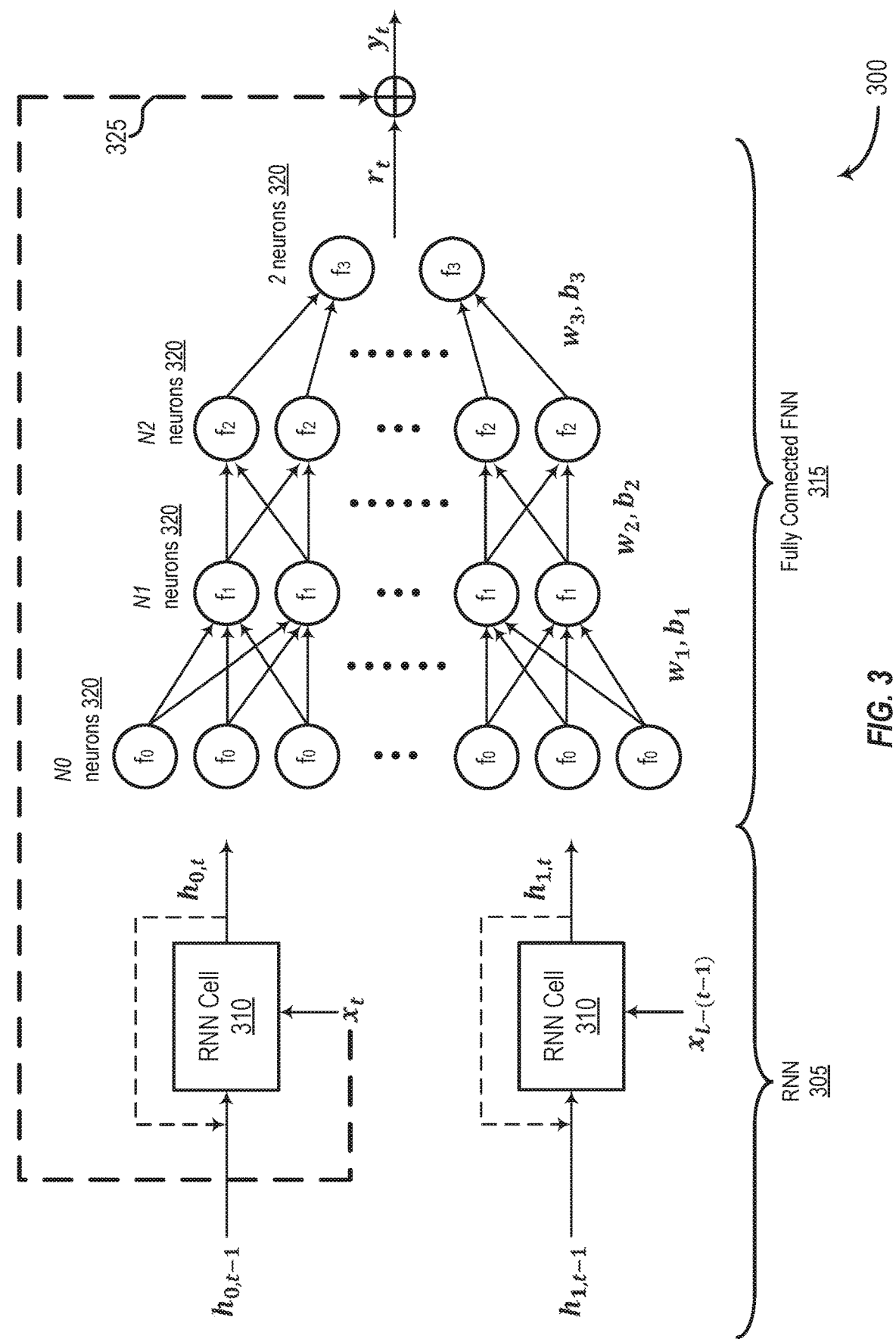
FIG. 3 shows an example of a residual bidirectional residual neural network (BiRNN) structure according to aspects of the present disclosure.

FIG. 3 shows an example of a residual BiLSTM network structure according to aspects of the present disclosure. Neural network 300 is an example of, or includes aspects of, the corresponding element described with reference to FIGS. 2 and 6. In one aspect, neural network 300 includes RNN 305, FNN 315, and residual 325. In one aspect, RNN 305 includes RNN cells 310. In one aspect, FNN 315 includes neurons 320 (e.g., FNN 315 may include a number of fully connected layers, each including a number of neurons 320).

RNN 305 may include or refer to a class of neural network (e.g. a class of artificial neural network (ANN)) in which connections between nodes form a directed graph along an ordered (i.e., a temporal) sequence. This enables an RNN 305 to model temporally dynamic behavior such as predicting what element should come next in a sequence. Thus, an RNN 305 is suitable for tasks that involve ordered sequences such as text recognition (where words are ordered in a sentence), power amplification of a time series signal, etc. In some aspects, the term "RNN" may include finite impulse recurrent networks (characterized by nodes forming a directed acyclic graph), and infinite impulse recurrent networks (characterized by nodes forming a directed cyclic graph).

In some examples, RNN 305 may include an LSTM (e.g., RNN cells 310 may include LSTM cells). An LSTM cell is a form of RNN cell 305 that includes feedback connections. In one example, and LSTM includes a cell, an input gate, an output gate and a forget gate. The cell stores values for a certain amount of time, and the gates dictate the flow of information into and out of the cell. LSTM networks may be used for making predictions based on series data where there can be gaps of unknown size between related information in the series. LSTMs can help mitigate the vanishing gradient (and exploding gradient) problems when training an RNN 305.

A fully connected neural network (e.g., fully connected FNN 315) includes a series of fully connected layers (e.g., fully connected layers of neurons 320). A fully connected layer is a function in which each output dimension depends on each input dimension.

According to the techniques described herein, an LSTM structure for PA behavioral modelling and digital pre-distortion may be extended to bidirectional LSTM (BiLSTM). BiLSTM may result in better PA linearization performance than LSTM (e.g., due to the 'bidirectional' feature of bidirectional RNNs). Generally residual learning may be used to improve the PA linearization performance and complexity. However, in many cases, residual learning may be applied in feedforward NN (e.g., in NNs for digital predistortion). For example, residual real-valued time-delay neural network (R2TDNN) techniques may enhance the performance of RVTDNN and TD-DNN. According to one or more aspects of the techniques described herein, residual learning may be applied in neural network 300 (e.g., in RNN 305), such as LSTM and BiLSTM. Moreover, techniques such as LSTM projection may speed up training convergence (e.g., for various applications, such as speech recognition). As described in more detail herein (e.g., as described in more detail herein, for example, with reference to FIGS. 6 and 7), LSTM projection may be used to develop a DPD structure with less computational complexity (training and pre-distortion phases), less memory required to store the DPD model coefficients, and faster training convergence speed.

A training sample input/output in BiLSTM is a consecutive complex baseband samples with sequence length L. $x_t$ ($t\in[1, L]$) may be defined as an input baseband sample, $y_t$ may be defined as a desired/reference output baseband sample, and $\hat{y}_t$ may be defined as an actual output baseband sample. $x_t$, $y_t$, or $\hat{y}_t$ may be a 2×1 vector representing the I/Q of a baseband signal sample at time instant t. In some aspects, $h_{0,t}$ denotes the hidden state output when passing $x_t$ into the network (e.g., in a forward direction), and $h_{1,t}$ denotes the hidden state output when passing $x_{L-(t-1)}$ into the network (e.g., in a reverse direction). For instance, the sizes of $h_{0,t}$ and $h_{1,t}$ may be H×1, where H is the hidden state size. The baseband samples may be passed into the LSTM cell recursively. For each passing direction, the output hidden state is the input hidden state for the next baseband sample passing. In some aspects, the multiple LSTM cells of a direction in the unfolded BiLSTM are for different time instants, and they may share the same network parameters.

In some aspects, a LSTM cell can be mathematically descried in equations (1)-(6), where the directional index 0 or 1 is removed (e.g., $h_t$ may stand for either $h_{0,t}$ or $h_{1,t}$):

$$i_t=\sigma(W_{ii}x_t+b_{ii}+W_{hi}h_{t-1}+b_{hi}) \quad (1)$$

$$f_t=\sigma(W_{if}x_t+b_{if}+W_{hf}h_{t-1}+b_{hf}) \quad (2)$$

$$g_t=\tan h(W_{ig}x_t+b_{ig}+W_{hg}h_{t-1}+b_{hg}) \quad (3)$$

$$o_t=\sigma(W_{io}x_t+b_{io}+W_{ho}h_{t-1}+b_{ho}) \quad (4)$$

$$c_t=f_t\odot c_{t-1}+i_t\odot g_t \quad (5)$$

$$h_t=o_t\odot \tan h(c_t) \quad (6)$$

where σ denotes the sigmoid function, tan h denotes the hyperbolic tangent function, and ⊙ denotes the Hadamard product (e.g., element-wise multiplication).

A fully connected feedforward network part (e.g., a fully connected FNN 315 part, with 4 layers, as shown in the example of FIG. 3) may be used after the hidden state outputs from the RNN 305 part (e.g., from an LSTM network part). The activation function for all neurons of the lth layer may be described as $f_l(\bullet)$ (e.g., where l=0, 1, 2, 3). The activation functions are linear when l=0, 3, ReLU when l=1, 2. The number of neurons for the lth layer may be described as $N_l$. For instance, $N_3$=2 for the output layer to represent I/Q data part, $N_0$=2H or 2P (e.g., in the case of LSTM projection). The input (e.g., before activation) to the lth layer may be defined as $z_l$, whose size is $N_l$×1. The input of the feedforward network part is the output from the LSTM network part (e.g., $z_0=[h_{0,t}^T h_{1,t}^T]^T$), and the final network output may be described as $\hat{y}_t=f_3(z_3)$. By comparing with the reference output $y_t$, error/loss function $E(\hat{y}_t,y_t)$ may be defined to be minimized during training. $W_l$ and $b_l$ (e.g., shown in FIG. 3) are the weighting and bias coefficients (between the $(l-1)^{th}$ and the $l^{th}$ layer) respectively. In some aspects, matrix $W_l$ may have a size of $N_l\times N_{l-1}$, and vector $b_l$ may gave a size of $N_l$×1. As such, the following relation may be defined:

$$z_l=W_lf_{l-1}(z_{l-1})+b_l, l\in[1,3] \quad (7)$$

FIG. 3 shows one or more aspects of a residual BiLSTM DPD structure. A reference residual signal $r_t$ may be defined as $r_t=y_t-x_t$, and the actual output residual signal $\hat{r}_t$ may be defined as $\hat{r}_t=\hat{y}_t-x_t$. In the example of FIG. 3, in some aspects, the output (e.g., the output from the $3^{rd}$ layer) in the feedforward network part is $\hat{r}_t$ (e.g., and is no longer $\hat{y}_t$). Note that the final output in FIG. 3 is still $\hat{y}_t$. Therefore, the input/output baseband sample pairs ($x_t$, $r_t$) may be used to train the NN (e.g., excluding the residual part in the example of FIG. 3), rather than ($x_t$, $y_t$) used in other preexisting models. The increased complexity during training and evaluation is very minor (e.g., it may include only additions in the baseband waveform, without any multiplication operations).

In the example of FIG. 3, $r_t=y_t-x_t$ may describe (e.g., define) the residual 325 signal/samples. Moreover, generally, RNN cells 310 may include or refer to RNN cells, LSTM cells, projected LSTM cells, GRU cells, etc. (e.g., as described in more detail herein). For instance, for implementing residual LSTM/BiLSTM techniques described herein, a device may use a LSTM cell (e.g., a LSTM cell described by equations (1)-(6)). In some examples, a key feature (e.g., the cell output $h_t$) may serve as the cell input for the next input sample $x_t$, and the intermediate outputs (e.g., $i_t$, $f_t$, $g_t$, $o_t$ and $c_t$) may have the same size. When using the LSTM cell, the reference output from the core NN module of the DPD during training may be the residual signal (e.g., $r_t=y_t-x_t$). The core NN module may be defined as, for example, the interior of the example neural network 300 shown in FIG. 3, the reference output may be defined as the output (e.g., $r_t$) from the output layer (or the last layer) of the NN model, etc.

For implementing LSTM projection layer techniques described herein, for example, a device may use a LSTM cell as a RNN cell 310 (e.g., a LSTM cell described by equations (1)-(6)). In some examples, a key feature (e.g., the cell output $h_t$) may serve as the cell input for the next input sample $x_t$, and the intermediate outputs (e.g., $i_t$, $f_t$, $g_t$, $o_t$ and $c_t$) may have the same size. When implementing the LSTM cell, the intermediate outputs ($i_t$, $f_t$, $g_t$, $o_t$ and $c_t$) may have the same size as that of the cell output $h_t$. If the intermediate outputs ($i_t$, $f_t$, $g_t$, $o_t$ and $c_t$) do not have the same size as that of the cell output $h_t$, then the LSTM projection layer is used.

Additionally or alternatively, according to the techniques described herein, LSTM projection may be applied (e.g., to BiLSTM DPD). That is, according to one or more aspects described herein, the LSTM cell structure may be improved. For instance, mathematically, equation (6) of a LSTM cell described above may be replaced by equations (8) and (9):

$$m_t = o_t \odot \tan h(c_t) \quad (8)$$

$$h_t = W_{hr} m_t \quad (9)$$

Accordingly, the size of hidden state $h_t$ may be changed to P×1 with a projection matrix $W_{hr}$, where P is the projection size. For example, Table 1 summarizes some differences of the parameters with and without LSTM projection techniques described herein (e.g., where u=i, f, g, o). With LSTM projection techniques described herein, the computational complexity of training and evaluation may be reduced, the memory required to store the pre-trained NN model may be reduced, etc.

TABLE 1

NN Parameters

| Parameters | Without LSTM Projection | With LSTM Projection |
|---|---|---|
| $W_{iu}$ | H × 2 | |
| $b_{iu}$, $b_{hu}$ | H × 1 | |
| $W_{hu}$ | H × H | H × P |
| $W_{hr}$ | N/A | P × H |
| $m_t$ | N/A | H × 1 |
| $h_t$ | H × 1 | P × 1 |
| $N_0$ | 2H | 2P |

To quantify possible complexity/memory reduction, an example scenario is described in Table 2 and the relative computational complexity (e.g., in terms of the number of multiplications) and memory required to store the NN model are summarized in Table 3. For easy comparison, the values for the scenario without projection are normalized to 1.

TABLE 2

Example Scenario Parameters

| Parameter | Value |
|---|---|
| L | 300 |
| H | 300 |
| $N_0$ | 600 |
| $N_1$ | 150 |
| $N_2$ | 200 |

TABLE 3

Relative Complexity/Memory Requirements

| | Without LSTM Projection | With LSTM Projection (P = 110) | With LSTM Projection (P = 80) | With LSTM Projection (P = 20) |
|---|---|---|---|---|
| Computational complexity during training | 1 | 0.62 | 0.47 | 0.16 |
| Computational complexity during evaluation (apply pre-distortion) | 1 | 0.47 | 0.35 | 0.12 |
| NN model memory requirement | 1 | 0.47 | 0.36 | 0.13 |

In some aspects, EVM may be used as a metric to evaluate the PA linearization performance of a DPD and techniques described herein. The used PA may be an envelope tracking PA. In some cases, for conventional GMP model, a closed-loop error correction (CL-EC) method may be used to compare with NN approaches. In some aspects, to train the DPD model from scratch, 15 and 10 training cycles may be used for CL-EC and NN approaches, respectively. 10 testing cycles are used for all approaches. During the testing cycles, the training is disabled, and the mean EVM is obtained for comparison. The tested signal is 80 MHz WiFi signal with PAPR 9 dB.

According to the techniques described herein (e.g., and as shown in Table 3), the complexity and memory of behavioral models of RF Pas (e.g., RNN models including BiLSTM models) can be reduced (e.g., by >50% when described LSTM projection techniques are applied, and by >80% when combined with described residual learning techniques). Moreover, the proposed BiLSTM convergence is faster than other BiLSTM models (e.g., which means the computational complexity during training is further reduced). In some implementations, linearization performance may be improved, or similar linearization performance as other BiLSTM models may be achieved but with much lower complexity and memory requirement. Additionally, it can be observed that implementing one or more aspects of the described BiLSTM methods outperforms other approaches in terms of EVM.

Moreover, a GRU model may be used to develop a BiGRU model for DPD. A BiGRU model may uses the general neural network 300 structure (e.g., or an analogous structure to neural network 300) in the example of FIG. 3. For instance, the RNN cell 310 may be described mathematically as:

$$q_t = \sigma(W_{iq}x_t + b_{iq} + W_{hq}h_{t-1} + b_{hq}) \quad (10)$$

$$p_t = \sigma(W_{ip}x_t + b_{ip} + W_{hp}h_{t-1} + b_{hp}) \quad (11)$$

$$n_t = \tan h(W_{in}x_t + b_{in} + q_t \odot (W_{hn}h_{t-1} + b_{hn})) \quad (12)$$

$$h_t = \sigma((1-p_t) \odot n_t + p_t \odot h_{t-1}) \quad (13)$$

where H×2 matrix $W_{iu}$ and H×H matrix $W_{hu}$ denote the weighting coefficients, H×1 columns $b_{iu}$ and $b_{hu}$ the bias coefficients (u=q, p, n), H×1 columns $h_t$ the hidden state, $n_0$=DH. In some aspects, the BiGRU model may not have a cell state. In some cases, the parameters shown in Table 2 may be used, for example.

In some examples, residual learning for a BiRNN models may be implemented, as described by both the solid lines and dash lines (e.g., residual 325 dashed line) in the example of FIG. 3. The neural network 300 model input $x_t$ may contribute to the final model reference output $z_t$. Therefore, the reference output from the FNN 315 part is the residual signal (e.g., residual 325) $z_t-x_t$. In other words, the coefficients of the RNN 305 and FNN 315 parts may be trained using sequence pairs $(x_t, z_t-x_t)$. By combining residual learning methods with aspects of the neural network 300 model described, various residual BiLSTM models, residual projected BiLSTM models, and residual BiGRU models are contemplated.

Figure 4:
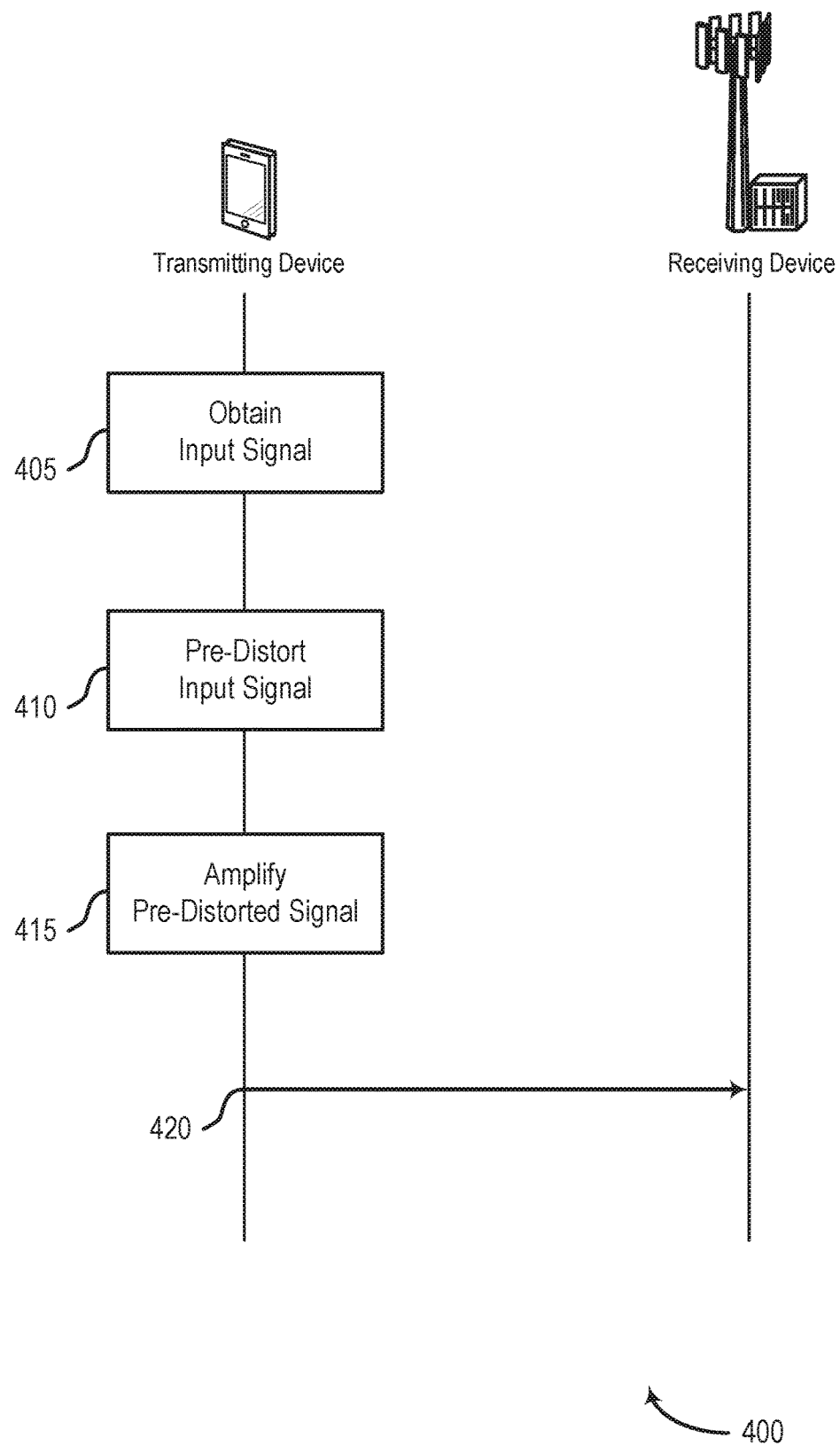
FIG. 4 shows an example of a method a process for power amplification of a signal according to aspects of the present disclosure.

Digital Pre-Distortion:

FIG. 4 shows an example of a method 400 for power amplification of a signal according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

As described herein (e.g., with reference to, for example, FIG. 1), a communication system may generally include a transmitting device and a receiving device. A transmitting device may perform various operations to prepare a signal (e.g., an information signal, a data signal, etc.) for transmission to a receiving device. For instance, a transmitting device may perform such operations to improve the likelihood of successful receipt of the transmission by a receiving device (e.g., such as by accounting for channel conditions, communication system characteristics, etc. in the preparation of transmitting the signal).

At operation 405, the system obtains an input signal. In some cases, the operations of this step refer to, or may be performed by, a transmitting device as described with reference to FIGS. 1 and 2. In some cases, the operations of this step refer to, or may be performed by, a processor as described with reference to FIG. 2.

At operation 410, the system pre-distorts the obtained signal. In some cases, the operations of this step refer to, or may be performed by, a DPD as described with reference to FIGS. 2 and 6. In some cases, the operations of this step refer to, or may be performed by, a neural network as described with reference to FIGS. 2, 3, and 6.

At operation 415, the system amplifies the pre-distorted signal. In some cases, the operations of this step refer to, or may be performed by, a PA as described with reference to FIGS. 2 and 6.

At operation 420, the system transmits the amplified signal (e.g., to a receiving device). In some cases, the operations of this step refer to, or may be performed by, a transmitter as described with reference to FIGS. 2 and 6.

Figure 5:
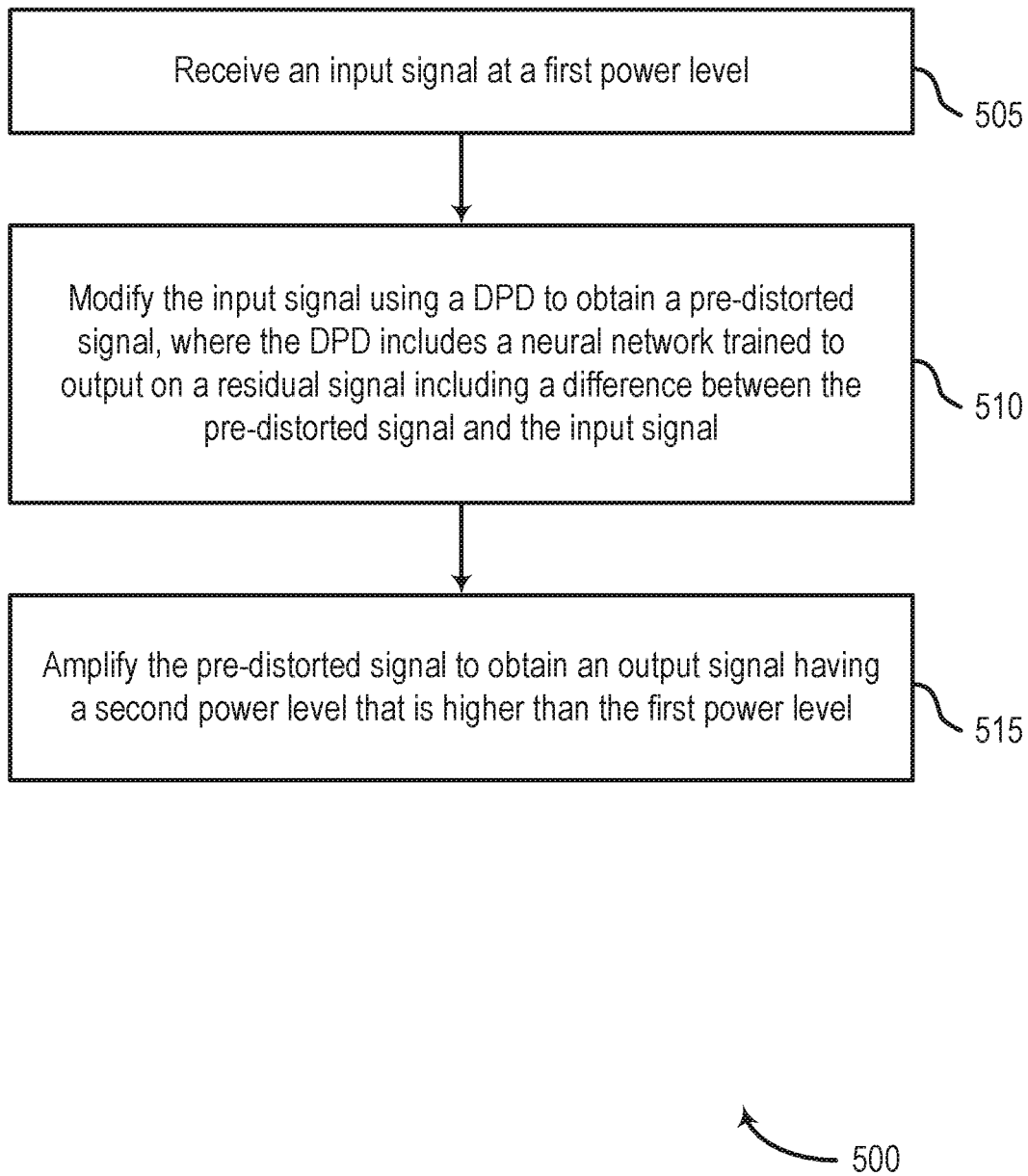
FIG. 5 shows an example of a method a method for radio frequency power amplification according to aspects of the present disclosure.

FIG. 5 shows an example of a method 500 for radio frequency power amplification according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

One or more aspects of the techniques and models described herein provide for BiLSTM-based DPDs with a LSTM projection layer to reduce computational complexity and memory requirements. Moreover, the described residual learning and LSTM projection features may be combined together to further reduce complexity and memory requirements.

Implementing the described unconventional techniques of applying residual learning in RNN (e.g., in BiLSTM), using LSTM projection to develop a DPD structure, or both, may provide several advantages over preexisting techniques. For instance, the complexity in training and pre-distortion may be reduced and significantly less memory may be required to store the NN DPD coefficients, with similar or better linearization performance (e.g., compared to other BiLSTM models). Further, faster training convergence speed may be achieved (e.g., compared to other BiLSTM models).

For instance, at operation 505 of the example method 500, the system receives (e.g., or obtains) an input signal at a first power level. For example, a transmitting device may obtain an input baseband signal that represent data or information to be transmitted to another device within a communications system. In some cases, obtaining the input signal may include identifying data or information to be transmitted, encoding the data or information, modulating the encoded data or the encoded information, etc. In some cases, the operations of this step refer to, or may be performed by, a DPD as described with reference to FIGS. 2 and 6.

At operation 510, the system modifies the input signal using a DPD to obtain a pre-distorted signal, where the DPD includes a neural network trained to output on a residual signal including a difference between the pre-distorted signal and the input signal. For instance, residual BiRNN models may be implemented for improved digital pre-distortion of RF PAs. As described in more detail herein (e.g., with reference to, for example, FIG. 3), such BiRNN models may include residual BiLSTM models, residual projected BiLSTM models, and residual BiGRU models. Such BiRNN models may reduce the per-sample complexity and required memory compared to other pre-distortion techniques (e.g., by 85% or more). Moreover, the proposed BiRNN models improve the ACLR and EVM compared to other pre-distortion techniques (e.g., by 1-4 dB at a low and a high gain compression), in addition to improving the EVM of the other FNN/CNN models (e.g., by at least 1.3 dB at the high gain compression). As described in more detail herein (e.g., with reference to FIGS. 3 and 6), such may be achieved by applying residual learning and LSTM projection in RNN-based DPD models. In some cases, the operations of step 510 refer to, or may be performed by, a DPD as described with reference to FIGS. 2 and 6.

At operation 515, the system amplifies the pre-distorted signal to obtain an output signal having a second power level that is higher than the first power level. For example, a transmitting device may utilize a PA to improve the reliability and efficiency of signals transmitted to a receiving device. For instance, a signal may be amplified by transmitting device to compensate for how a signal may propagate from the transmitting device to the receiving device. As described in more detail herein (e.g., with reference to, for example, FIGS. 1 and 2), the improved pre-distortion techniques implemented at operation 510 may more efficiently compensate for nonlinearity of a PA (e.g., such that the amplification of the pre-distorted signal at operation 515 results in a more reliable/accurate output signal). In some cases, the operations of this step refer to, or may be performed by, a PA as described with reference to FIGS. 2 and 6.

Some examples of the method 500 further include generating a hidden representation of the input signal using an RNN. Some examples further include generating the residual signal based on the hidden representation using an FNN. Some examples further include combining the residual signal with the input signal to obtain the pre-distorted signal.

Some examples of the method 500 further include multiplying the hidden representation by a projection matrix to obtain a projected hidden representation, wherein the residual signal is generated based on the projected hidden representation. In some aspects, the projected hidden representation has fewer dimensions that the hidden representation.

Some examples of the method 500 further include performing a digital-to-analog conversion on the pre-distorted signal to obtain an analog signal, wherein the output signal is based on the analog signal. Some examples of the method 500 further include performing up-conversion on the pre-distorted signal to obtain a high-frequency signal, wherein the output signal is based on the high-frequency signal. Some examples of the method 500 further include transmitting the output signal to a receiver (e.g., to a receiving device).

Figure 6:
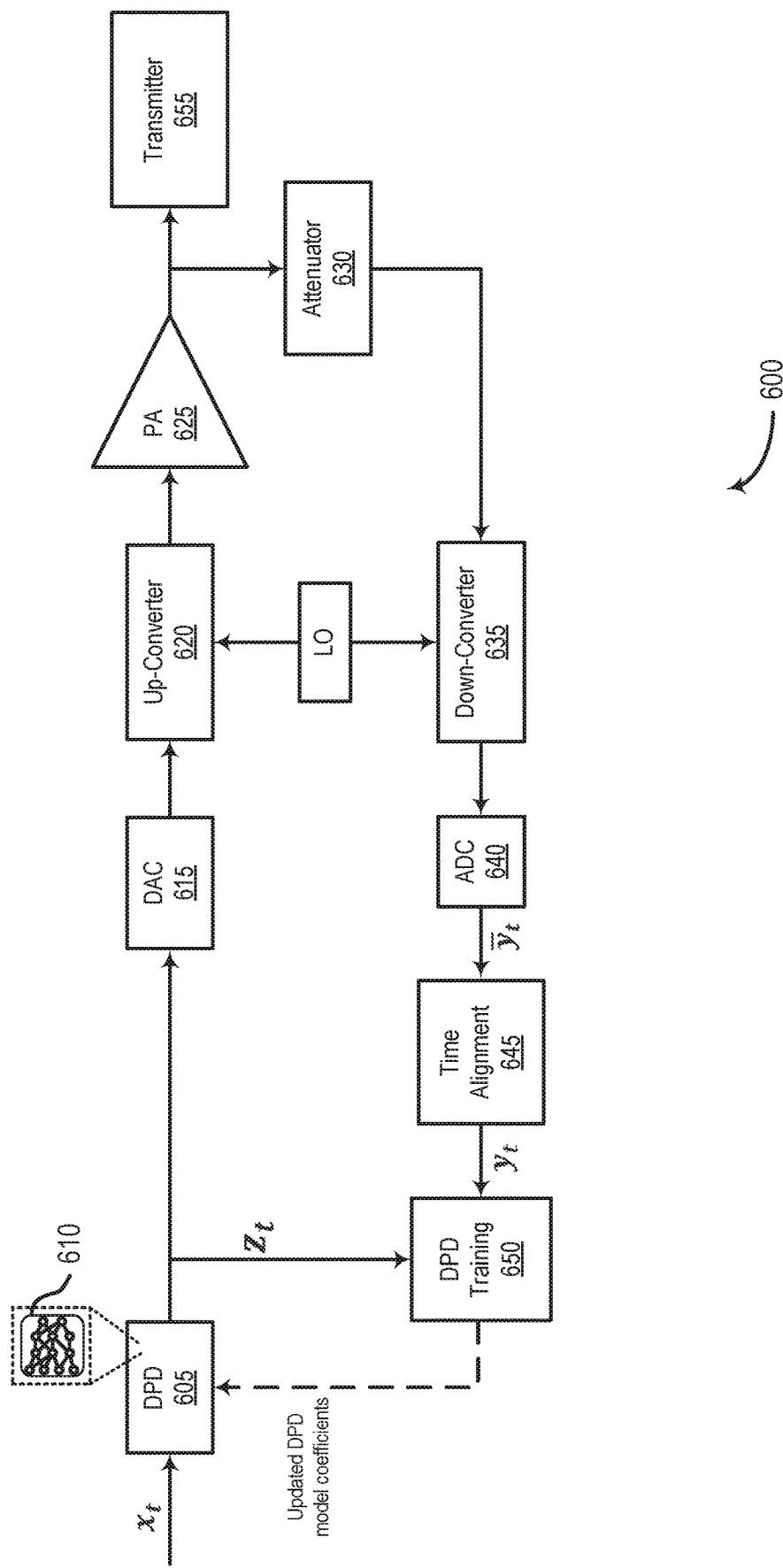
FIG. 6 shows an example of a power amplifier (PA) architecture according to aspects of the present disclosure.

Training:

FIG. 6 shows an example of a PA architecture 600 according to aspects of the present disclosure. In one aspect, PA architecture 600 includes DPD 605, DAC 615, up-converter 620, PA 625, attenuator 630, down-converter 635, ADC 640, time alignment component 645, DPD training component 650, and transmitter 655. DPD 605 is an example of, or includes aspects of, the corresponding element described with reference to FIG. 2. In one aspect, DPD 605 includes neural network 610. Neural network 610 is an example of, or includes aspects of, the corresponding element described with reference to FIGS. 2 and 3. DAC 615, up-converter 620, PA 625, and transmitter 655 are each examples of, or each include aspects of, the respective corresponding elements described with reference to FIG. 2.

PA architecture 600 (e.g., which may be an example of an indirect learning architecture (ILA)) may be used for a DPD system in radio transmitters. In some aspects, PA architecture 600 may have a forward and an observation path. For instance, the forward path may include DPD 605, DAC 615, up-converter 620, and PA 625. The observation path may include attenuator 630, down-converter 635, ADC 640, time alignment component 645, and DPD training component 650. Both up-conversion and down-conversion may be controlled by a local oscillator (LO) (e.g., up-converter 620 and down-converter 635 may be controlled by a LO). In some cases, for improved modeling performance, the DPD system may use high sampling rates (e.g., such as 5× signal bandwidth). The attenuator 630 may be used to align the output gain with the input for training purposes. The time alignment (e.g., time alignment component 645) may be used overcome the time delay of the signal through the forward and observation paths. This time delay may be estimated using cross-correlation between the signal after ADC 640 and the DPD input $x_t$. During a training phase, the DPD coefficients may be updated iteratively over multiple cycles. As described in FIG. 6, in each cycle, a batch of DPD output samples $z_t$ in the forward path and received samples $y_t$ in the observation path may be used to update the DPD coefficients. Then, the updated DPD 605 may be used to pre-distort a batch of modulated baseband samples $x_t$ in the next cycle. In some cases, the DPD 605 may be disabled in the first cycle.

As such, a DPD system of PA architecture 600 may have an observation path as described in FIG. 6, which may generate nonstationary training data over multiple cycles. Such techniques may provide several advantages. For instance, other systems (e.g., system not implementing one or more aspect of the techniques described herein) may perform training in a single cycle offline, which may lead to a modeling mismatch when a DPD is enabled after training (e.g., since the PA behavior may change with changed characteristic of signal $z_t$ exciting the PA. Moreover, the described techniques may enable improved time alignment in the observation path when generating training data, which may reduce transmit latency in forward path designs. Further, due to reduced hidden size enabled by the present disclosure, computational complexity and the amount of memory may be reduced compared to other systems (e.g., as described in more detail herein, computational complexity and memory requirements may be reduced by reducing hidden size, which may decrease the number of model coefficients).

The term "loss function" refers to a function that impacts how a machine learning model is trained in a supervised learning model. Specifically, during each training iteration, the output of the model is compared to the known annotation information in the training data. The loss function provides a value for how close the predicted annotation data is to the actual annotation data. After computing the loss function, the parameters of the model are updated accordingly, and a new set of predictions are made during the next iteration.

In some aspects, the residual (e.g., $r_t$) may apply to training in the observation path. The residual may also apply to the DPD 605 in the forward path during operation. For instance, the input to DPD 605 is $x_t$, and the neural network output (e.g., the output of neural network 300) is the residual signal $r_t = y_t - x_t$, and the final output from the DPD 605 may be $y_t$. During a training phase, the final output form the DPD 605 (e.g., $y_t$) may be used as the reference output for training.

DPD 605 may be used to compensate for the nonlinearity of the PA 625. The DPD 605 may implement, or may be referred to as, one or more techniques of pre-distorting an input signal according to characteristics complementary to the nonlinearity of the PA 625.

For example, the DPD 605 may generate a pre-distorted signal (e.g., a baseband pre-distorted signal $y_t$) by performing the pre-distortion on the input signal $x_t$. The DPD 605 may provide the pre-distorted signal $y_t$ to the transmitter 655 (e.g., through DAC 615, up-converter 620, etc.). The PA 625 may generate the output signal by amplifying the pre-distorted RF signal. As the DPD 605 performs the predistortion on the input signal $x_t$, the nonlinearity of the PA 625 may be compensated for. In an embodiment, the DPD 605 may perform a digital pre-distortion on the input signal $x_t$.

According to some aspects, attenuator 630 attenuates the output signal. In some examples, attenuator 630 attenuates the output signal to obtain an attenuated output signal, where the residual signal is based on the attenuated output signal.

According to some aspects, time alignment component 645 performs a temporal alignment on the attenuated output signal, where the reference residual signal is based on the aligned attenuated output signal.

According to some aspects, DPD training component 650 receives an input signal. In some examples, DPD training component 650 modifies the input signal using a DPD 605 to obtain a pre-distorted signal, where the DPD 605 includes a neural network 610 that generates a residual signal representing a difference between the pre-distorted signal and the input signal. In some examples, DPD training component 650 computes a reference residual signal based on the pre-distorted signal. In some examples, DPD training component 650 trains the neural network 610 based on a comparison of the residual signal and the reference residual signal. In some examples, DPD training component 650 generates a hidden representation of the training input signal using an RNN. In some examples, DPD training component 650 generates the residual signal based on the hidden representation using an FNN. In some examples, DPD training component 650 combines the residual signal with the input signal to obtain the pre-distorted signal. In some examples, DPD training component 650 amplifies the pre-distorted signal to obtain an output signal. In some aspects, an observation path with time alignment is used in the DPD system of PA architecture 600 to remove the transmit latency in the proposed BiRNN approaches.

Generally, one or more aspects of the techniques described herein (e.g., including at least residual learning techniques described herein) do not only apply to bidirectional/two directions RNN (BiRNN), but such aspects may also apply to single direction RNN models by analogy, without departing from the scope of the present disclosure.

Figure 7:
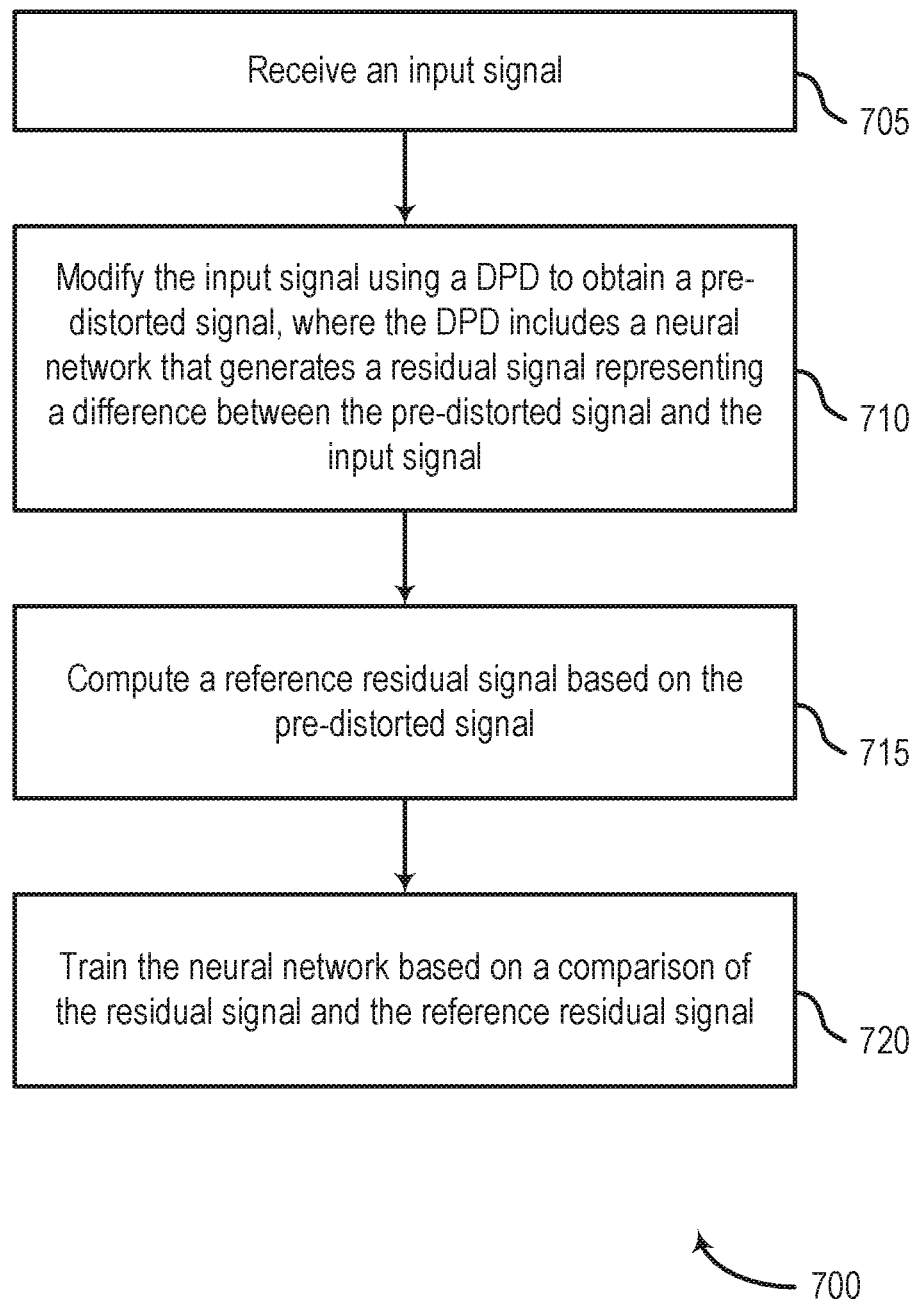
FIG. 7 shows an example of a method for radio frequency power amplification according to aspects of the present disclosure.

FIG. 7 shows an example of a method 700 for radio frequency power amplification according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 705, the system receives an input signal. In some cases, the operations of this step refer to, or may be performed by, a DPD training component as described with reference to FIG. 6.

At operation 710, the system modifies the input signal using a DPD to obtain a pre-distorted signal, where the DPD includes a neural network that generates a residual signal representing a difference between the pre-distorted signal and the input signal. In some cases, the operations of this step refer to, or may be performed by, a DPD training component as described with reference to FIG. 6.

At operation 715, the system computes a reference residual signal based on the pre-distorted signal. In some cases, the operations of this step refer to, or may be performed by, a DPD training component as described with reference to FIG. 6.

At operation 720, the system trains the neural network based on a comparison of the residual signal and the reference residual signal. In some cases, the operations of this step refer to, or may be performed by, a DPD training component as described with reference to FIG. 6.

Some examples of the method 700 further include generating a hidden representation of the training input signal using an RNN. Some examples further include generating the residual signal based on the hidden representation using an FNN. Some examples further include combining the residual signal with the input signal to obtain the pre-distorted signal.

Some examples of the method 700 further include amplifying the pre-distorted signal to obtain an output signal. Some examples further include attenuating the output signal. Some examples further include performing a temporal alignment on the attenuated output signal, wherein the reference residual signal is based on the aligned attenuated output signal.

Some examples of the method 700 further include attenuating the output signal to obtain an attenuated output signal, wherein the residual signal is based on the attenuated output signal.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described systems and methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method comprising:
receiving an input signal at a first power level;
modifying the input signal using a digital pre-distorter (DPD) to obtain a pre-distorted signal by generating a hidden representation of the input signal using a recurrent neural network (RNN) cell of a neural network, generating a residual signal representing a difference between the input signal and the pre-distorted signal based on the hidden representation using a fully-connected neural network (FNN) layer of the neural network, and adding the residual signal to the input signal to obtain the pre-distorted signal; and
amplifying the pre-distorted signal to obtain an output signal having a second power level that is higher than the first power level.

2. The method of claim 1, further comprising:
multiplying the hidden representation by a projection matrix to obtain a projected hidden representation, wherein the residual signal is generated based on the projected hidden representation.

3. The method of claim 2, wherein:
the projected hidden representation has fewer dimensions than the hidden representation.

4. The method of claim 1, further comprising:
performing a digital-to-analog conversion on the pre-distorted signal to obtain an analog signal, wherein the output signal is based on the analog signal.

5. The method of claim 1, further comprising:
performing up-conversion on the pre-distorted signal to obtain a high-frequency signal, wherein the output signal is based on the high-frequency signal.

6. The method of claim 1,
wherein the DPD comprises one or more neural network structures(s) selected from the group consisting of a long short-term memory (LSTM), a bidirectional long short-term memory (BiLSTM), and a bidirectional gated recurrent unit (BiGRU).

7. A method of training a neural network, the method comprising:
receiving an input signal;
modifying the input signal using a digital pre-distorter (DPD) to obtain a pre-distorted signal, wherein the DPD comprises a neural network that generates a residual signal representing a difference between the pre-distorted signal and the input signal;
producing an output signal by amplifying the pre-distorted signal,
producing a feedback signal by attenuating the output signal,
performing a temporal alignment on the feedback signal to obtain an aligned feedback signal,
computing a reference residual signal based on the aligned feedback signal; and
training the neural network based on a comparison of the residual signal and the reference residual signal.

8. The method of claim 7, further comprising:
generating a hidden representation of the training input signal using a recurrent neural network (RNN);
generating the residual signal based on the hidden representation using a feedforward neural network (FNN); and
combining the residual signal with the input signal to obtain the pre-distorted signal.

9. The method of claim 7, wherein the residual signal is based on the feedback signal.

10. An apparatus for radio frequency power amplification, comprising:
a processor configured to generate an input signal at a first power level;
a digital pre-distorter (DPD) configured to modify the input signal to obtain a pre-distorted signal, wherein the DPD comprises a recurrent neural network (RNN) trained based on a residual signal comprising a difference between a training input signal and a training reference signal; and
an amplifier configured to amplify the pre-distorted signal to obtain an output signal having a second power level that is higher than the first power level,
wherein the RNN comprises one or more neural network structure(s) selected from the group consisting of a long short-term memory (LSTM), a bidirectional long short-term memory (BiLSTM), a projected RNN, and a bidirectional gated recurrent unit (BiGRU).

11. The apparatus of claim 10, wherein:
the DPD comprises a feedforward neural network (FNN).

12. The apparatus of claim 10, wherein:
the RNN comprises the long short-term memory (LSTM).

13. The apparatus of claim 10, wherein:
the RNN comprises the bidirectional long short-term memory (BiLSTM).

14. The apparatus of claim 10, wherein:
the RNN comprises the projected RNN.

15. The apparatus of claim 10, wherein:
the RNN comprises the bidirectional gated recurrent unit (BiGRU).

16. The apparatus of claim 10, further comprising:
a digital-to-analog converter (DAC) configured to convert the pre-distorted signal to an analog signal.

17. The apparatus of claim 10, further comprising:
an up-converter configured to convert the pre-distorted signal to a higher frequency.

18. The apparatus of claim 10, further comprising:
a transmitter configured to transmit the output signal.

* * * * *